(12) United States Patent
Schauer et al.

(10) Patent No.: US 9,243,319 B2
(45) Date of Patent: *Jan. 26, 2016

(54) SENSOR SYSTEM FOR SEMICONDUCTOR MANUFACTURING APPARATUS

(75) Inventors: Ronald Vern Schauer, Gilroy, CA (US); Raphael Dascoli, Genoble (FR); Shivan Bhargava, Saint Martin D Heres (FR)

(73) Assignee: Applied Materials, Inc., Santa Clara, CA (US)

(*) Notice: Subject to any disclaimer, the term of this patent is extended or adjusted under 35 U.S.C. 154(b) by 696 days.

This patent is subject to a terminal disclaimer.

(21) Appl. No.: 13/366,498

(22) Filed: Feb. 6, 2012

(65) Prior Publication Data

US 2012/0136622 A1    May 31, 2012

Related U.S. Application Data

(63) Continuation of application No. 12/363,157, filed on Jan. 30, 2009, now Pat. No. 8,135,560.

(51) Int. Cl.
  *G01P 3/489*  (2006.01)
  *G01P 3/44*   (2006.01)
  (Continued)

(52) U.S. Cl.
  CPC ........ *C23C 14/505* (2013.01); *H01L 21/67115* (2013.01); *H01L 21/681* (2013.01); *H01L 21/6838* (2013.01); *H01L 21/68792* (2013.01)

(58) Field of Classification Search
  CPC .................................. G06F 15/00; G01P 3/00
  USPC ....................................................... 702/145
  See application file for complete search history.

(56) References Cited

U.S. PATENT DOCUMENTS 5,474,643 A * 12/1995 Arami et al. ............. 156/345.24
5,863,348 A *  1/1999 Smith et al. ..................... 134/18
(Continued)

FOREIGN PATENT DOCUMENTS

EP         1 049 139      11/2000
WO      WO 02/35586       5/2002
(Continued)

OTHER PUBLICATIONS

European Examiner Stephane Lachaud, EPO Search Report for Application No. 10151935.3, dated Oct. 12, 2012, 9 pages.
(Continued)

*Primary Examiner* — Sujoy Kundu
*Assistant Examiner* — Alvaro Fortich
(74) *Attorney, Agent, or Firm* — Fish & Richardson P.C.

(57) ABSTRACT

A chamber monitoring system may include a parallel architecture in which a single sensor control system is coupled to a number of different processing chamber control board sensor lines. In an illustrative embodiment, a single rotation sensor such as a tachometer may reside as a central control unit remote from the processing chambers such that rotation data may be processed by a single system and thereafter routed according to a variety of different network communication protocols to the main system controller, a factory interface, or both. In this and other embodiments, pull-up networks in the central control unit and the chamber control boards are matched so as to reduce electrical signal anomalies such as crowbar effects. The central control unit may be programmed via a main system controller to operate according to user defined parameters, which in turn may enable the system to differentiate between certain operating states.

17 Claims, 9 Drawing Sheets

(51) Int. Cl.
*C23C 14/50* (2006.01)
*H01L 21/67* (2006.01)
*H01L 21/68* (2006.01)
*H01L 21/683* (2006.01)
*H01L 21/687* (2006.01)

(56) References Cited

U.S. PATENT DOCUMENTS

| | | | |
|---|---|---|---|
| 6,454,926 B1* | 9/2002 | Ritzdorf et al. | 205/96 |
| 6,461,494 B1* | 10/2002 | Batz et al. | 205/123 |
| 6,641,701 B1 | 11/2003 | Tepman | |
| 6,936,153 B1* | 8/2005 | Ritzdorf | 205/123 |
| 8,135,560 B2 | 3/2012 | Schauer et al. | |
| 2002/0124801 A1* | 9/2002 | Hanson | 118/728 |
| 2002/0129770 A1 | 9/2002 | Okamoto et al. | |
| 2003/0023340 A1 | 1/2003 | Kitamoto et al. | |
| 2007/0111699 A1* | 5/2007 | Hsu et al. | 455/343.2 |
| 2007/0185687 A1* | 8/2007 | Speasl et al. | 702/185 |
| 2007/0215481 A1* | 9/2007 | Graham et al. | 205/123 |
| 2008/0280453 A1 | 11/2008 | Koelmel et al. | |
| 2009/0265137 A1* | 10/2009 | Iida et al. | 702/183 |
| 2010/0032587 A1* | 2/2010 | Hosch et al. | 250/492.3 |
| 2010/0106992 A1 | 4/2010 | Schauer | |
| 2010/0138583 A1 | 6/2010 | Schauer | |
| 2011/0304475 A1* | 12/2011 | Higgins et al. | 340/870.07 |

FOREIGN PATENT DOCUMENTS

| | | |
|---|---|---|
| WO | WO 02/061807 | 8/2002 |
| WO | WO 2007/126016 | 11/2007 |

OTHER PUBLICATIONS

'DeviceNet' [online]. Wikipedia, 2007 [retrieved on Jul. 13, 2010]. Retrieved from the Internet: <URL: http://web.archive.org/web/20071124053830/http://en.wikipedia.org/wiki/DeviceNet>.

'QSPXM Quantum™ Seriplex™ Master' [online]. Niobrara Research and Development Corporation, 2008 [retrieved on Jul. 13, 2010]. Retrieved from the Internet: <URL: http://www.niobrara.com/index.html>.

'Motrona control: Tachometers, Speed Displays, Frequency Counters' [online]. Motrona GmbH, 2008 [retrieved on Jul. 13, 2010]. Retrieved from the Internet: <URL: http://web.archive.org/web/20080112090721/http:/www.motrona.com/tachometer_e.html>.

J. Borenstein et al. "Where am I? Sensors and Methods for mobile Robot Positioning" University of Michigan, 1996. Retrieved on Jul. 20, 2010, 29 pages.

'Rockwell Automation 6675' [online] Retrieved from the Internet: <URL: http://shop.industrialpartner.com/R/rockwell-automation/6675.htm#>.

* cited by examiner

SENSOR SYSTEM FOR SEMICONDUCTOR MANUFACTURING APPARATUS

CLAIM OF PRIORITY

This application claims priority under 35 USC §120 as a continuation of U.S. patent application Ser. No. 12/363,157, filed on Jan. 30, 2009, the entire contents of which are hereby incorporated by reference.

BACKGROUND

In the fabrication of integrated circuits and displays, semiconductor, dielectric, and electrically conducting materials are formed on a substrate, such as a silicon substrate or a glass substrate. The materials, in some examples, can be formed by chemical vapor deposition (CVD), atomic layer deposition (ALD), physical vapor deposition (PVD), ion implantation, plasma or thermal oxidation, and nitridation processes. Thereafter, the deposited materials can be etched to form features such as gates, vias, contact holes and interconnect lines. In a typical deposition or etch processes, the substrate is exposed to a plasma in a substrate processing chamber to deposit or etch material on the substrate surface. Other typical processes that may be performed on a substrate may include thermal processing techniques that may include RTP, flash lamp, or laser annealing processes.

Physical vapor deposition (PVD), or sputtering, is one of the most commonly used processes in fabrication of integrated circuits and devices. PVD is a plasma process performed in a vacuum chamber where a negatively biased target (typically, a magnetron target) is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate pedestal which generally faces the target. During the processes discussed above, the substrate is typically held on a substrate support having a substrate receiving surface. The support can have an embedded electrode that serves as a plasma generating device during processing and/or it may also be charged to electrostatically hold the substrate. The support can also have a resistance heating element to heat the substrate during processing, and/or a water cooling system to cool the substrate or to cool the support. One issue that arises is that as device sizes decrease the tolerance to variation across the substrate has become very low such that the alignment and positioning of a substrate relative to the substrate support, shadow ring, or other chamber components can have an affect on the uniformity of the process results achieved on the substrate. In some cases, one or more regions in a process chamber may be unable to uniformly generate a plasma (e.g., PECVD, PVD), uniformly deliver heat to the substrate (e.g., RTP, PECVD), and/or have regions of non-uniform gas flow due to the position orientation of the gas inlet or exhaust in the processing chamber, which commonly creates the need to rotate the substrate to average out the non-uniformities seen in different areas of the processing region of the processing chamber.

SUMMARY

A chamber monitoring system may include a parallel architecture in which a single sensor control system is coupled to a number of different processing chamber control board sensor lines. In an illustrative embodiment, a single rotation sensor such as a tachometer may reside in a central control unit remote from the processing chambers such that rotation data may be processed by a single system and thereafter routed according to a variety of different network communication protocols to the main system controller, a factory interface, or both. In this and other embodiments, pull-up networks in the central control unit and the chamber control boards are matched so as to reduce electrical signal anomalies such as crowbar effects. The central control unit may be programmed via a main system controller to operate according to user defined parameters, which in turn may enable the system to differentiate between certain operating states. As an example, the central control unit may be set with revolutions per minute (RPM) out-of-bounds conditions that permit the system to alert a user that the rotating apparatus is reciprocating rather than continuously rotating.

DETAILED DESCRIPTION OF ILLUSTRATIVE EMBODIMENTS

Exemplary Rotating Substrate Support in a Physical Vapor Deposition Chamber

Figure 1:
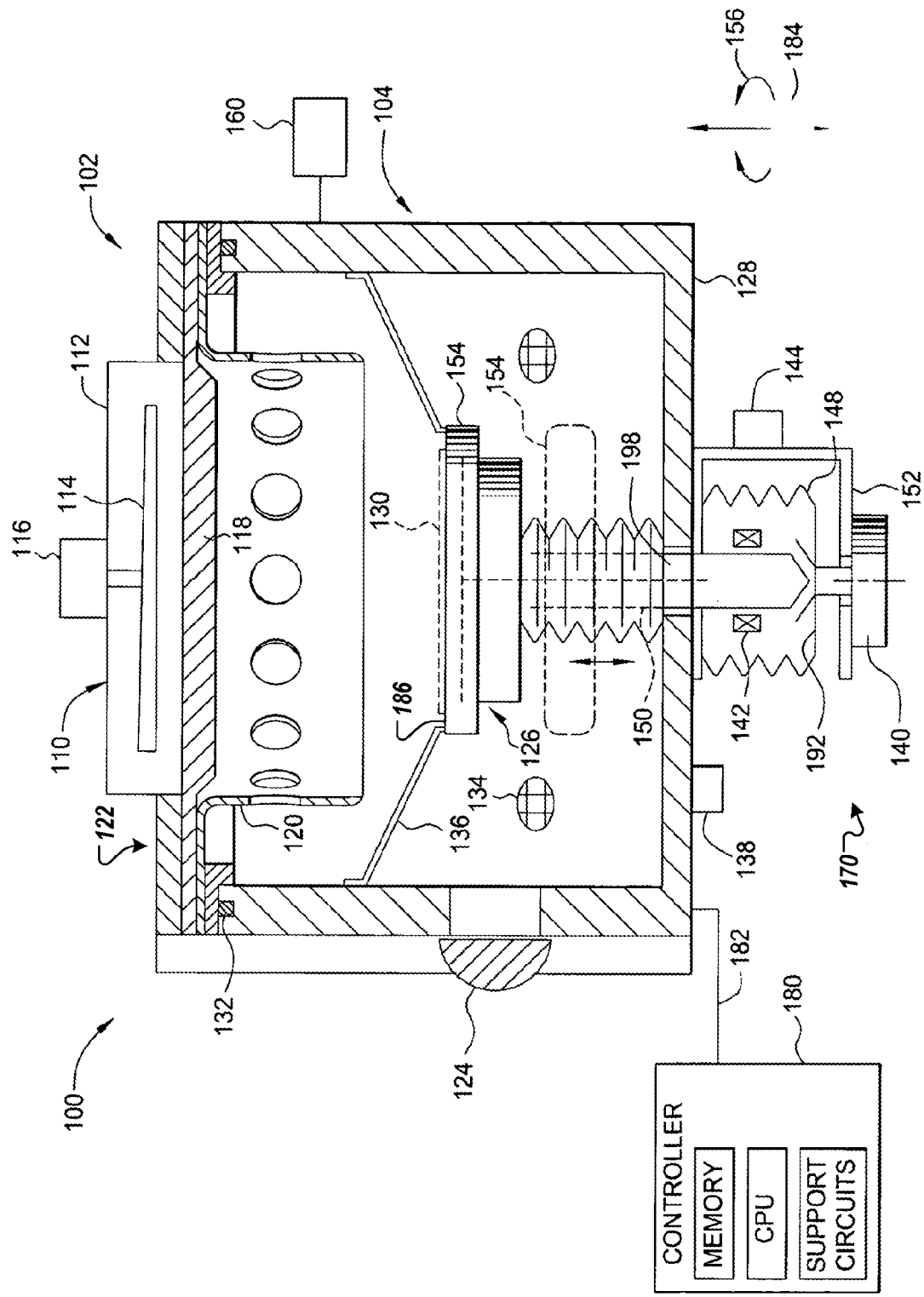
FIG. 1 is a schematic sectional view of one embodiment of a PVD chamber having a rotatable substrate pedestal.

FIG. 1 depicts one embodiment of a PVD chamber 100 having a rotatable substrate pedestal 126. The PVD chamber 100 generally comprises a lid assembly 102, a main assembly 104, a motion control unit 170, support systems 160, and a controller 180. In one embodiment, the lid assembly 102 includes a target assembly 110 and an upper enclosure 122. The target assembly 110 includes a rotatable magnetron pack 114 disposed within a target base 112 (e.g., water-cooled base), a target 118, and a target shield 120. The magnetron pack 114 is mechanically coupled to a drive 116 that, in operation, rotates the pack at a pre-determined angular velocity. One magnetron pack that may be adapted to benefit from the invention is described in U.S. Pat. No. 6,641,701, issued Nov. 4, 2003 to A. Tepman. The target assembly 110 is electrically coupled to a plasma power supply (not shown), such as an RF, DC, pulsed DC, and the like power supply.

In one embodiment, the main assembly 104 includes a chamber body 128, the rotatable substrate pedestal 126, an inverted shield 136 circumferentially attached to the body 128, and a plurality of radiant heaters 134. The shield 136 generally extends from the upper portion of the member body 128 downward and inward toward the pedestal 126. The substrate pedestal 126 includes a substrate platen 154 and a column module 150 that are coupled to one another. Vacuum-tight coupling between the lid assembly 102 and the main assembly 104 is illustratively provided by at least one seal, of which an o-ring 132 is shown.

A substrate 130 (e.g., silicon (Si) wafer, and the like) is introduced into and removed from the PVD chamber 100 through a slit valve 124 in the chamber body 128. The radiant heaters 134 (e.g., infrared (IR) lamps, and the like) are generally used to pre-heat the substrate 130 and/or internal parts of the chamber 100 to a temperature determined by a specific process recipe. As the radiant heaters 134 are positioned below the shield 136, the heaters 134 are protected from deposition of the sputtered target material that may adversely affect heater performance.

In operation, the platen 154 may be selectively disposed in an upper processing position (as shown) or in a lower transfer position (shown in phantom). During wafer processing (i.e., sputter deposition), the platen 154 is raised to the upper position located at a pre-determined distance from the target 118. To receive or release the substrates 130, the platen 154 is moved to the lower position substantially aligned with the slit valve 124 to facilitate robotic transfer of the substrate.

The platen 154 may include at least one polymer member disposed in an upper substrate supporting surface of the platen 154. The polymer member may be a suitable plastic or elastomer. In one embodiment, the polymer member is an o-ring disposed in a groove. In operation, friction between the substrate 130 and the o-ring may prevent the wafer from slipping along a substrate supporting surface 186 of the rotating platen 154.

The platen 154 may include an annular peripheral rim extending upward from the surface and an annular peripheral and upwardly facing trench. The rim may define a substrate receiving pocket in the surface that provides additional protection from substrate slippage at higher angular velocities of the platen 154. In some embodiments, the rim may be chamfered, angled, rounded or otherwise adapted to guide the substrate 130 for positioning with a minimal offset from a center of the platen 154.

In other embodiments, the platen 154 may comprise a clamp ring, an electrostatic chuck, embedded substrate heaters, passages for backside (i.e., heat exchange) gas and/or cooling fluid, radio-frequency electrodes, and other means known to enhance a PVD process. Coupling to the respective sources (not shown) of the backside gas, cooling fluid, and electric and radio-frequency power may be accomplished using a conventional means known to those skilled in the art.

Returning to FIG. 1, the motion control unit 170 generally includes bellows 148, a magnetic drive 144, a displacement drive 140, and a lift pins mechanism 138 that are illustratively mounted on a bracket 152 attached to the chamber body 128. The bellows 148 provide an extendable vacuum-tight seal for the column module 150 that is rotateably coupled (illustrated with an arrow 156) to a bottom plate 192 of the bellows. A vacuum-tight interface between the bracket 152 and the chamber body 128 may be formed using, e.g., one or more o-rings or a crushable copper seal (not shown).

The column module 150 includes a shaft 198 and a plurality of magnetic elements 142 disposed proximate to the magnetic drive 144. In operation, the magnetic drive 144 includes a plurality of stators that may be selectively energized to magnetically rotate the magnetic elements 142, thereby rotating column module 150 and the platen 154. In one exemplary embodiment, the angular velocity of the substrate pedestal 126 is selectively controlled in a range of about 10 to 100 RPM. It is contemplated that the magnetic drive may be replaced by other motors or drives suitable for rotating the pedestal.

In operation, the flux of the material sputtered from the target 118 is spatially non-uniform because of variations in the material composition of the target, accumulation of contaminants (e.g., oxides, nitrides, and the like) on the target, mechanical misalignments in the lid assembly 102, and other factors. During film deposition in the PVD chamber 100, the rotational motion of the substrate pedestal 126 compensates for such spatial non-uniformity of the flux of the sputtered material and deposit, on the rotating substrate 130, highly uniform films. For example, variation in sputtered material from different regions of the target 118 are averaged across substrate 130 as it rotates, thus resulting in high thickness uniformity of the deposited films.

The displacement drive 140 is rigidly coupled to the bottom plate 192 of the bellows 148 and, in operation, facilitates moving (illustrated with an arrow 184) the substrate pedestal 126 between the lower (i.e., wafer receiving/releasing) position and the upper (i.e., sputtering) position. The displacement drive 140 may be a pneumatic cylinder, hydraulic cylinder, motor, linear actuation or other device suitable for controlling the elevation of the pedestal 126.

The support systems 160 comprise various apparatuses that, collectively, facilitate functioning of the PVD chamber 100. Illustratively, the support systems 160 include one or more sputtering power supplies, one or more vacuum pumps, sources of a sputtering gas and/or gas mixture, control instruments and sensors, and the like known to those skilled in the art.

The controller 180 comprises a central processing unit (CPU), a memory, and support circuits (none is shown). Via an interface 182, the controller 180 is coupled to and controls components of the PVD chamber 100, as well as deposition processes performed in the chamber.

Exemplary Processing System Configuration

Figure 2:
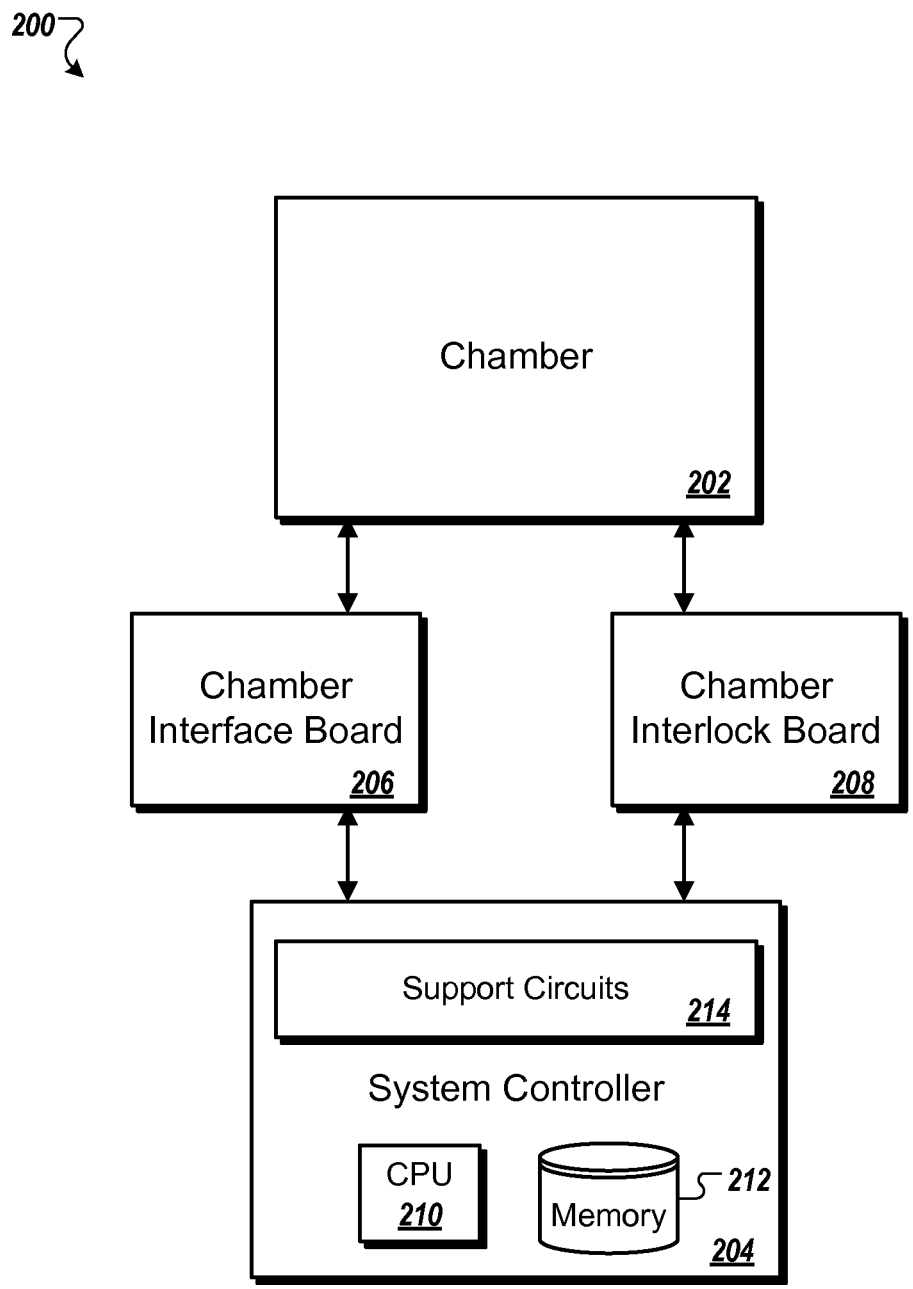
FIG. 2 is an exemplary system diagram illustrating a processing chamber system including a processing chamber and a system controller.

FIG. 2 is an exemplary system diagram illustrating a processing chamber system 200 including a processing chamber 202 and a system controller 204, interconnected by a chamber interface board 206 and a chamber interlock board 208.

The system controller 204 is adapted to control the various components used to complete the substrate support assembly (e.g., the rotating assembly 150 as shown in FIG. 1) and the processing chamber 202 (e.g., the reactor 100 as described in FIG. 1). The system controller 204 is generally designed to facilitate the control and automation of the overall process chamber 202 and typically includes a central processing unit (CPU) 210, a memory 212, and support circuits (or I/O) 214. The CPU 210 may be one of any form of computer processors that are used in industrial settings for controlling various system functions, chamber processes and support hardware (e.g., detectors, robots, motors, fluid sources, etc.) and monitor the processes (e.g., substrate support temperature, power supply variables, chamber process time, I/O signals, etc.). The memory 212 is connected to the CPU 210, and may be one or more of a readily available memory, such as random access memory (RAM), read only memory (ROM), floppy disk, hard disk, or any other form of digital storage, local or remote. Software instructions and data can be coded and stored within the memory 212 for instructing the CPU 210. The support circuits 214 are also connected to the CPU 210 for supporting the processor in a conventional manner. The support circuits 214 may include cache, power supplies, clock circuits, input/output circuitry, subsystems, and the like. A program (or computer instructions) readable by the system controller 204 determines which tasks are performable on a substrate. Preferably, the program is software readable by the system controller 204 that includes code to perform tasks relating to monitoring, execution and control of the movement, support, positioning, and/or rotation of a substrate along with the various process recipe tasks and various chamber process recipe steps being performed in the processing chamber 202.

The system controller 204 interfaces with the chamber interlock board 208 to control elements of the chamber 202, for example, which may benefit from safety interlock mechanisms (e.g., relays, hardware switches, etc.). For example, the chamber cover release mechanism may be accessible to the system controller 204 via the chamber interlock board 208. Before the cover may be opened, for example, the system controller 204 may first halt the processing within the processing chamber 202. The interlocks may aid the system controller 204 in verifying that one or more gas valves are shut, the voltage feed is disabled, etc. before disengaging the lock mechanism within the lid of the processing chamber 202.

The system controller 204 interfaces with the chamber interface board 206 to control elements of the processing chamber 202 which may not be attributed with significant safety concerns. In some implementations, the processing system 200 does not include the chamber interlock board 208. In other implementations, the chamber interface board 206 and the chamber interlock board 208 may be designed within a single circuit board.

Exemplary Sensor System for Monitoring the Rotation of a Single Element

Figure 3:
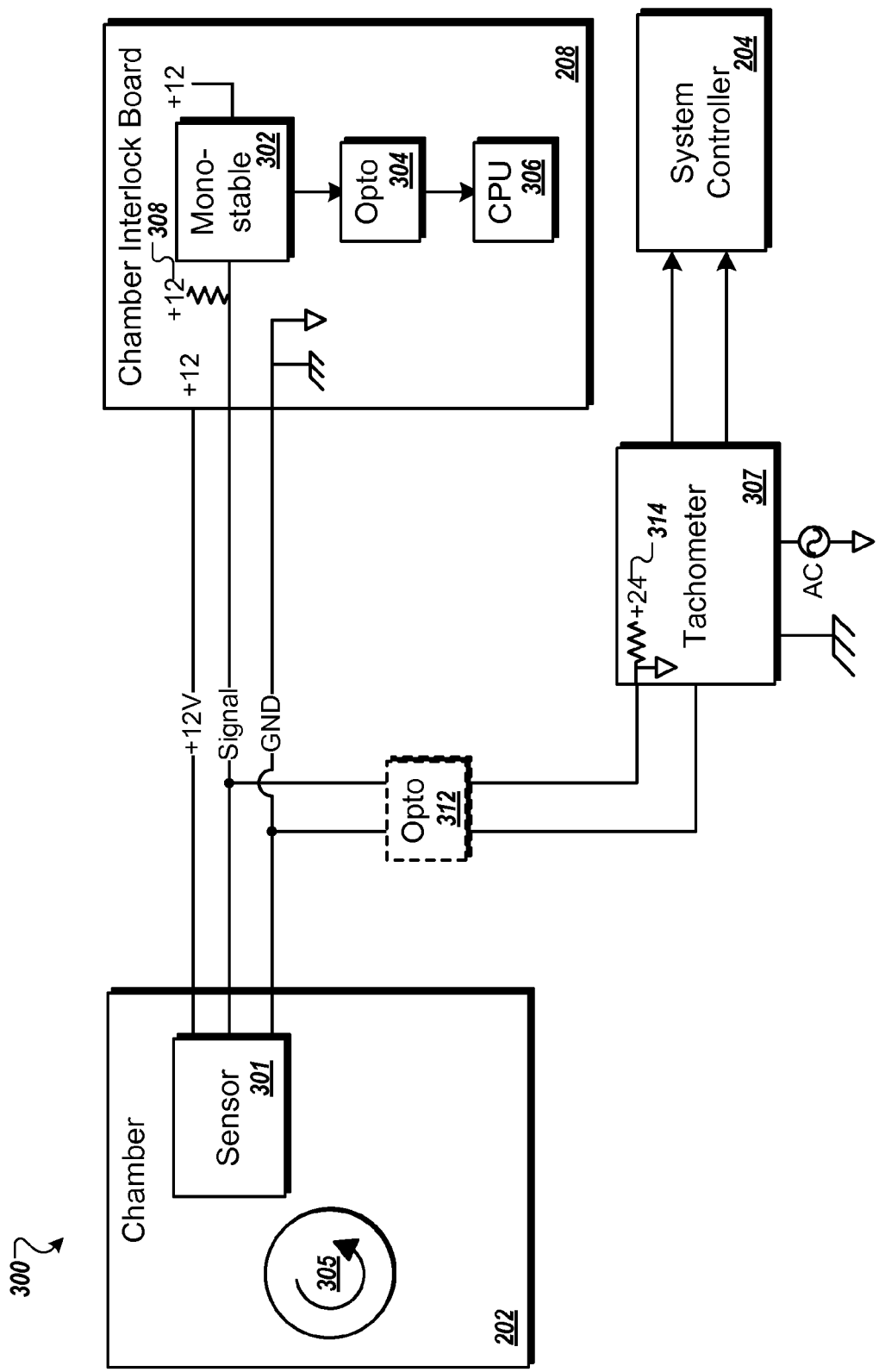
FIG. 3 illustrates an exemplary sensor system for monitoring the rotation of a substrate support.

FIG. 3 illustrates an exemplary sensor control system 300 for monitoring the rotation of a mechanism disposed within a processing chamber. The system 300, for example, may be used to monitor the rotatable substrate pedestal 126 or the rotatable magnetron pack 114 as described in FIG. 1. The system 300 includes a sensor 301 which each monitors a rotating element 305 (e.g., substrate support, magnetron, etc.) within the chamber 202. The sensor 301, in some examples, may include an optical sensor, proximity sensor, Hall effect sensor, or other sensing device capable of determining the position and/or movement of the rotating element 305.

One or more sensor lines connect the sensor 301 to the chamber interlock board 208. For example, the chamber interlock board 208 may process the output of the sensor 301 to determine whether or not to disengage the rotation of a substrate support until the lift pins of the substrate support are in the lowered position or until the substrate support has been lifted into deposition position. In other implementations, the sensor 301 may connect to the chamber interface board 206.

The sensor 301 also connects to a tachometer 307. The tachometer 307, for example, may be implemented with an off-the-shelf tachometer such as the DX 020 panel tachometer available through Motrona GmbH of Rielasingen, Germany. The tachometer 307 receives signals (e.g., voltage pulses) from the sensor 301 and translates the signals into a voltage output, the voltage output levels being associated with the RPM of the rotating element 305. For example, the tachometer 307 may time the distance between pulses received from the sensor 301. In another example, the tachometer 307 may count the number of pulses received from the sensor 301 over a period of time.

The signal line of the sensor 301 feeds into a monostable multivibrator 302 within the chamber interlock board 208. The monostable multivibrator 302, for example, may be included in a safety mechanism which monitors whether or not the rotating element 305 is revolving. The chamber interlock board 208 may provide the output of the safety mechanism, for example, to the system controller 204. The system controller 204 may check the output of the safety mechanism to verify that the rotating element 305 is not revolving before initiating the next processing step within the processing chamber 202. In some implementations, the chamber interlock board 208 may only be concerned with whether or not the rotational element 305 is in movement, not with the actual speed of the rotational element 305.

The monostable multivibrator 302 feeds into an opto-isolator 304. The opto-isolator 304 may provide protection to a CPU 306 from the signals received by the monostable multivibrator 302. For example, the opto-isolator 304 may buffer the CPU 306 from voltage transients.

The CPU 306 receives a sensor output value from the monostable multivibrator 302 (e.g., rotation on/off) and may use this information for determining whether or not a safety concern exists. In some implementations, the CPU 306 may provide this information to the system controller 204 which may determine whether or not a safety concern exists.

The tachometer 307 calculates the RPM of the rotating element 305 and outputs a corresponding voltage level. For example, the tachometer 307 may output a voltage level ranging from zero to ten volts, ten volts being indicative of a rotational speed of two hundred RPM. In some implementations, the tachometer 307 may include a display. For example, an LCD screen attached to the tachometer 307 may provide a user with the current RPM measurement. The tachometer 307 may be mounted on the outer surface of the chamber 202, for example, or in an easily accessible location in the vicinity of the chamber 202 (e.g., on a nearby wall, equipment rack, or other surface).

The tachometer 307 couples to the signal and ground lines of the sensor 301 to make use of the sensor readings 301 for determining the RPM speed of the rotating element 305. As described in FIG. 3, the tachometer 307 may provide the system controller 3 204 with a voltage output which maps to an RPM range.

Depending upon the hardware composition of the off-the-shelf tachometer 307, however, there may be ground and cross-talk incompatibility problems introduced to the system 300. For example, the opto-isolator 304 may create galvanic isolation between the CPU 306 and the rest of the system 300. The introduction of the tachometer 307 may introduce a ground potential issue and cross-talk, which in turn may defeat the galvanic isolation at the CPU 306.

The signal input of the tachometer 307, for example, may include a +24 Volt pull-up network 314. The chamber interlock board 208 may similarly include a +12 Volt pull-up network 308 at the signal input from the sensor 301. When the switch mechanism of the monostable multivibrator 302 is in the off position, for example, the signal line of the sensor 301 may float between approximately sixteen and eighteen Volts or more. This may cause forward biasing at the monostable multivibrator 302 (e.g., a CMOS circuit). If the monostable multivibrator 302 is biased above its own input supply (e.g., twelve Volts), it may latch up. This may produce a crowbar effect between the plus and minus rails which may cause damage to the chamber interlock board 208.

To defeat the forward biasing of the monostable multivibrator 302, an optional opto-isolator (not shown) may be introduced to the signal and ground sensor lines of the sensor 301 before they enter the chamber interlock board 208. In addition to or instead of the optional opto-isolator mentioned above, an optional opto-isolator 312 may be introduced to the signal and ground input lines of the tachometer 307 (which are coupled to the signal and ground sensor lines of the sensor 301). For example, the optional opto-isolator 312 can provide isolation and avoid crowbar effects.

The system controller 204 receives the output of the tachometer 307. The system controller 204 may use this information to allow a user to monitor the rotational speed of the rotating element 305. In some implementations, the system controller 204 may generate an alarm condition based upon the output of the tachometer 307. For example, if the output voltage received from the tachometer 307 reaches zero, the system controller 204 may generate an error indicating that the rotating element 305 is no longer in motion. In the system 300, the tachometer 307 couples directly to the signal and ground sensor lines of the sensor 301.

The system 300 may scale for a multi-chamber processing system (e.g., the multi-chamber processing system 200 as described in FIG. 2), with each chamber being monitored by a separate tachometer, each tachometer being individually coupled to the system controller 204.

Exemplary Sensor System for Monitoring the Rotation of up to Eight Elements

Figure 4:
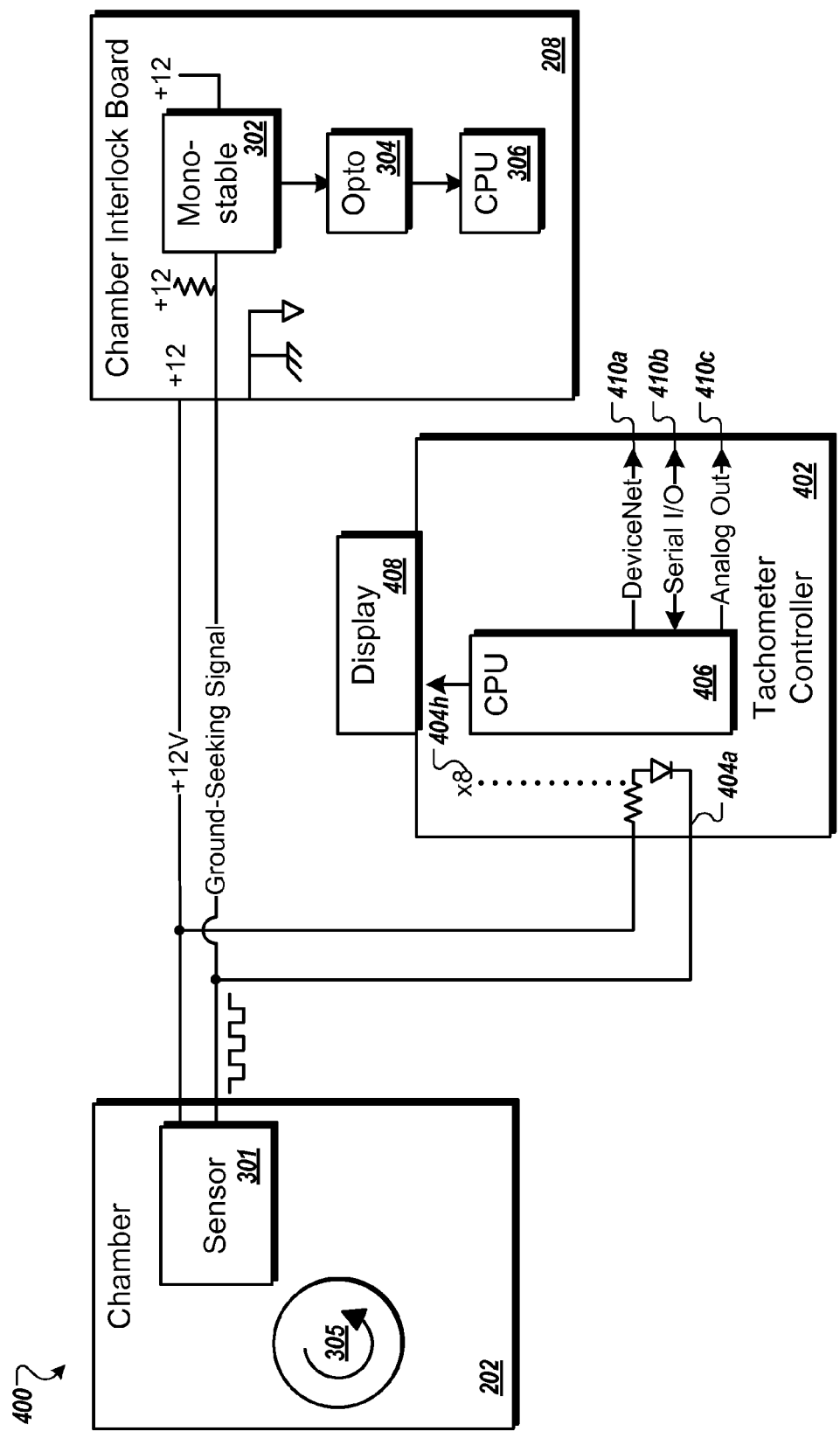
FIG. 4 is a circuit diagram illustrating an exemplary chamber monitoring system in which a sensor control system may be coupled to a number of different sensors using a parallel architecture.

FIG. 4 is a circuit diagram illustrating an exemplary chamber monitoring system 400 in which a sensor control system 402 may be coupled to a number of different sensors using a parallel architecture. For example, the sensor control system 402 may monitor two or more sensors which are disposed in the same or different processing chambers. In some implementations, the sensor control system 402 may analyze data from each individual sensor according to user-specified conditions. The sensor control system 402, in some implementations, may provide the sensor data and/or any information obtained through analyzing the sensor data to the system controller 204, an interface of a multi-chamber processing system, or another computer system.

In the illustrated example, the sensor 301 is connected to the chamber interlock board 208 in the same manner as described in FIG. 3, except the sensor ground is not extended into the chamber interlock board 208. The signal line extending from the sensor 301 may be a ground-seeking digital signal. The sensor control system 402 couples to the signal line and the +12 Volt power line of the sensor 301.

The exemplary sensor control system 402, for example, may accept up to eight optically isolated sensor inputs 404. In some implementations, the number of sensor inputs can be scaled, for example to allow inputs from hundreds of channels. The circuitry involved in the sensor inputs 404 is described in greater detail with respect to FIG. 6. A CPU 406 provides tachometer functionality individually for each of the eight sensor inputs 404. For example, up to eight sensors, attached to up to eight processing chambers, may connect to the sensor control system 402.

In some implementations, more than one sensor may be disposed within a single chamber. For example, a particular chamber may have both a rotating substrate support and a rotating magnetron (e.g., the rotatable substrate pedestal 126 and the rotatable magnetron pack 114 as described in FIG. 1) being monitored by sensor devices.

Instead of using a single sensor for monitoring a rotating device within a chamber, in some implementations sensor data belonging to the two separate sensors may monitored in relation to a single rotating device. The consistency in RPM values between the two sensors may be compared, for example, to determine whether a rotating device is reciprocating rather than revolving. For example, a user may establish parameters within the sensor control system regarding the receipt of data from each sensor device (e.g., if data from sensor device "A" is not followed by data from sensor device "B", or if the RPM value associated with the sensor device "A" is not essentially equal to the RPM value associated with the sensor device "B", assert an error condition).

In some implementations, the number of sensor inputs can be scaled. For example, a sensor control system may receive inputs from up to several thousand channels of sensor inputs. Port expanding chips, for example, can be tied into one or more CPU interrupts (e.g., in a priority interrupt handler chain) to channel sensor data into the exemplary sensor control system 402.

In some implementations, the sensor control system 402 may be designed into the system controller 204. In other implementations, the sensor control system 402 may be implemented as a separate entity from the system controller 204. For example, the sensor control system 402 may be mounted on or alongside the system controller 204. The sensor control system 402 may or may not communicate with the system controller 204.

The sensor control system 402 may include a display 408 (e.g., LCD screen, LED display, etc.) which, for example, may provide the user with a visual representation of the current speed of rotation (in RPM) of the rotational elements being monitored by each of the up to eight sensors connected to the sensor inputs 404 of the sensor control system 402. Other information may be included within the display 408 including, but not limited to, an identification of each device (e.g., chamber identification) being monitored by a sensor, an indication of whether or not an individual input port of the sensor control system 402 is presently connected to a sensor, or a warning mechanism if an error condition has been detected within one or more of the devices being monitored by the sensors coupled to the sensor control system 402.

An error condition, for example, may occur when a rotating element becomes stuck. For example, if the rotating element 305 were to begin to reciprocate rather than revolve, the sensor 301 may issue measurement pulses which the sensor control system 402 translates to a very high RPM value (e.g., a greater than anticipated RPM value such as 200 RPM or 1000 RPM, depending upon the functionality of the monitored rotating element). The CPU 406 may recognize the high RPM value as an error condition and log an error or otherwise alert the user. In some implementations, a user may establish out-of-bounds conditions for the functionality of one or more monitored devices. For example, a user may specify that any rotation measurement below 10 RPM or above 200 RPM is cause for generating an error alert.

In some implementations, a higher maximum RPM value may be achieved by using a higher frequency CPU clock. For example, if sensor inputs are processed by the sensor control system 402 (e.g., received and incremented) at a schedule based upon a multiple of the CPU clock frequency, a higher frequency clock may provide an opportunity for higher maximum RPM limits while maintaining the same detection granularity.

To alert the user to the present conditions of each of the sensors connected to the sensor control system 402, the sensor control system 402 may supply information to the user via a set of input/output (I/O) lines 410. The I/O lines 410 may communicate information using a variety of network communication protocols. In some examples, the I/O lines 410 may include a sensor bus line 410a, a serial I/O line 410b, and an analog output line 410c.

The sensor bus line 410a may be implemented using a DeviceNet network bus. DeviceNet is an open protocol maintained by the Open DeviceNet Vendor Association for a sensor bus, which allows several devices (e.g., motors, sensors, heaters, lamps, etc.) in a system (e.g., a multi-chamber processing system) to communicate over a single bus with a controller (e.g., the system controller 204) that provides commands to the devices to perform their operations (e.g., activation, deactivation, rotation, etc.) and receives feedback from the devices concerning system operation (e.g., wafer position, actual gas flow rate, temperature, etc). The system controller 204, for example, may send commands over the DeviceNet network to control the functions of the individual devices. Another sensor bus networking protocol that may be used in addition to or instead of DeviceNet is Seriplex available from Square D Company of Raleigh, N.C.

The serial I/O line 410b may be implemented using a multidrop serial link. The multidrop serial link, in some examples, may accept up to sixty-three sensor devices daisy-chained on a single serial port. Each sensor device, for example, may be addressed using a unique device identification value.

In some implementations, standard telephone wire (e.g., RJ-14) may be used to connect individual sensor devices into the multidrop serial link. Communications between the sensor control system 402 and the daisy-chained sensor devices, for example, may be implemented using ASCII, ASCII hexadecimal, or standard ASCII control characters. Half-duplex communications between the sensor control system 402 and each sensor device connected to the multidrop serial link may be initiated by the sensor control system 402.

The serial I/O line 410b, for example, may be used to couple the output of the sensor control system 402 to a multi-chamber processing system which may in turn communicate information between individual processing chambers and the sensor control system 402. In one example, the 200 millimeter ENDURA platform available from Applied Materials, Inc. of Santa Clara, Calif. includes a limited number of communication ports. If a user desires communication between individual processing chambers of a multi-chamber Endura 200 mm processing system, the serial I/O line 410b of the sensor control system 402 may be coupled to the front panel port of the single port computer controller of the multi-chamber Endura 200 mm processing system.

The analog output line 410c may include up to eight individual analog output lines, one dedicated to each of the sensor inputs 404.

Information provided to the sensor control system 402 over the I/O lines 410 (e.g., from the system controller 204) may include, but is not limited to, RPM limits for each rotating element (e.g., the range in which a rotating element is not in an error condition), activation/deactivation of the monitoring of a particular sensor (e.g., based upon the steps of the process recipe, whether or not the rotating element is supposed to be rotating), or other settings associated with each sensor (e.g., logging settings, error alert settings, etc.). In some implementations, the sensor control system 402 is provided with step changes in the expected RPM value associated with one or more sensors (e.g., due to a processing chamber switching to the next step of a processing recipe, etc.) and/or quality metrics such as an acceptable range of the calculated RPM value (e.g., an anticipated RPM value of fifty RPM plus or minus two RPM) or other statistical information. For example, quality metrics can indicate flutter in readings.

The sensor control system 402 may provide rotation data and, optionally, other information to one or more remote systems connected to the I/O lines 410, in some examples, on a scheduled basis, when an alarm condition has been recognized, or upon request from the remote system. In some implementations, the output of the sensor control system 402 may be used by the system controller 3 204 to generate device log entries, error alerts, etc.

Figure 5:
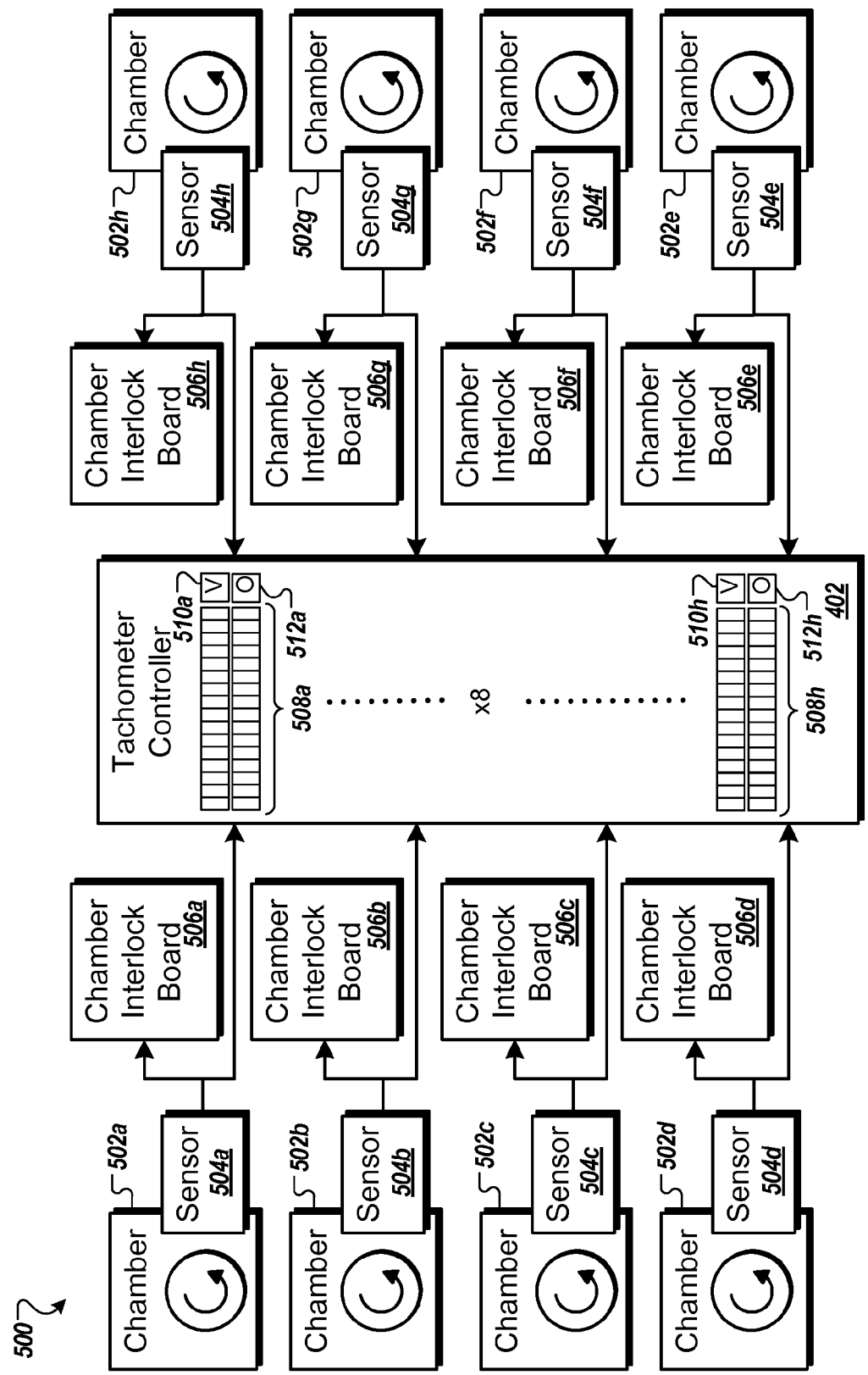
FIG. 5 is a system diagram illustrating a sensor control system coupled to multiple processing chambers in a chamber monitoring system.

FIG. 5 is a system diagram illustrating the sensor control system 402 coupled to multiple processing chambers 502 in a chamber monitoring system 500. Each processing chamber 502 includes a sensor 504 which monitors a rotating element (e.g., substrate support, magnetron, etc.). Each sensor 504 is connected to a chamber interlock board 506 and to the sensor control system 402.

The sensor control system 402 may provide tachometer measurement for each of the sensors 504. The sensor control system 402, in some implementations, may count the number of pulses received from each sensor 504 over a period of time. The number of pulses received per unit of time, for example, may be used to calculate an RPM value.

The sensor control system 402, in some implementations, may contain one or more banks of counters 508 associated with each sensor 504. For example, two 16-bit banks of counters 508 may be provided for each sensor 504. The sensor control system 402 may increment the first counter bank 508 on a set interrupt schedule (e.g., timer) and transfer the present value stored within the first counter bank 508 to the second counter bank 508 upon receipt of an input from the sensor 504 (e.g., a voltage pulse equating to a single revolution of a monitored rotating element).

For example, the first counter bank 508 may be incremented every thousandth of a second. Using a 16-bit counter, the first counter bank 508 may overflow every 6.5535 seconds. When the first counter bank 508 overflows, an overflow flag 510 may be set. If no interrupt has been received by the sensor 504a during this period of time, the sensor control system 402 (e.g., software, firmware, etc.) may determine that the rotating element is stopped and output an RPM value of zero. For example, for practical purposes, if a rotating element is revolving at a slower rate than 10 RPM, it may be considered to be in an error condition (e.g., stalled or slowed). In some implementations, a user may establish a minimum RPM value which the sensor control system 402 may use to recognize error conditions.

When a pulse is received by the sensor 504a, for example, the sensor control system 402 may transfer the present value of the first counter bank 508a to the second counter bank 508a for the sensor 504a and reset the first counter bank 508a. The sensor control system 402 may then set a valid flag 510a and (optionally) reset the overflow flag 512a. The sensor control system 402 may process the sampled value stored within the second counter bank 508a to determine the length of time since the previous pulse was received.

If the first counter bank 508a has overflowed, the sensor control system 402 may set the overflow flag 512a, reset the valid flag 510a, and reset both the first counter bank 508a and the second counter bank 508a to zero.

During a communications housekeeping routine, the software (or firmware) of the sensor control system 402 may check each valid flag 510, processing the data collected within the second counter bank 508 if the valid flag is set to true to determine the current RPM value associated with each bank of counters 508. The communications housekeeping routine may provide the processed rotational data to the display 408 and/or one or more remote systems connected to the sensor control system 402 via the I/O lines 410 (as shown in FIG. 4). In some implementations, if the housekeeping routine calculates an RPM value above a threshold value (e.g., 200 RPM), the housekeeping routine may assume that an error condition has been detected. The housekeeping routine may include resetting the valid flag 510 after the data has been processed.

If the communications housekeeping routine finds that the valid flag 510 is set to false, the housekeeping routine can update the display 408 and/or the I/O lines 410 to broadcast an error condition.

Although the system 500 illustrates a single sensor 504 per chamber 502, in some implementations, more than one sensor 504 may be installed within a particular chamber 502. For example, the chamber 502 may have both a rotating substrate support and a rotating magnetron which are monitored by the sensor control system 402. In some implementations, rather than connecting to the chamber interlock boards 506, the sensors 504 may be connected to chamber interface boards (e.g., the chamber interface board 206 as shown in FIG. 2).

Figure 6:
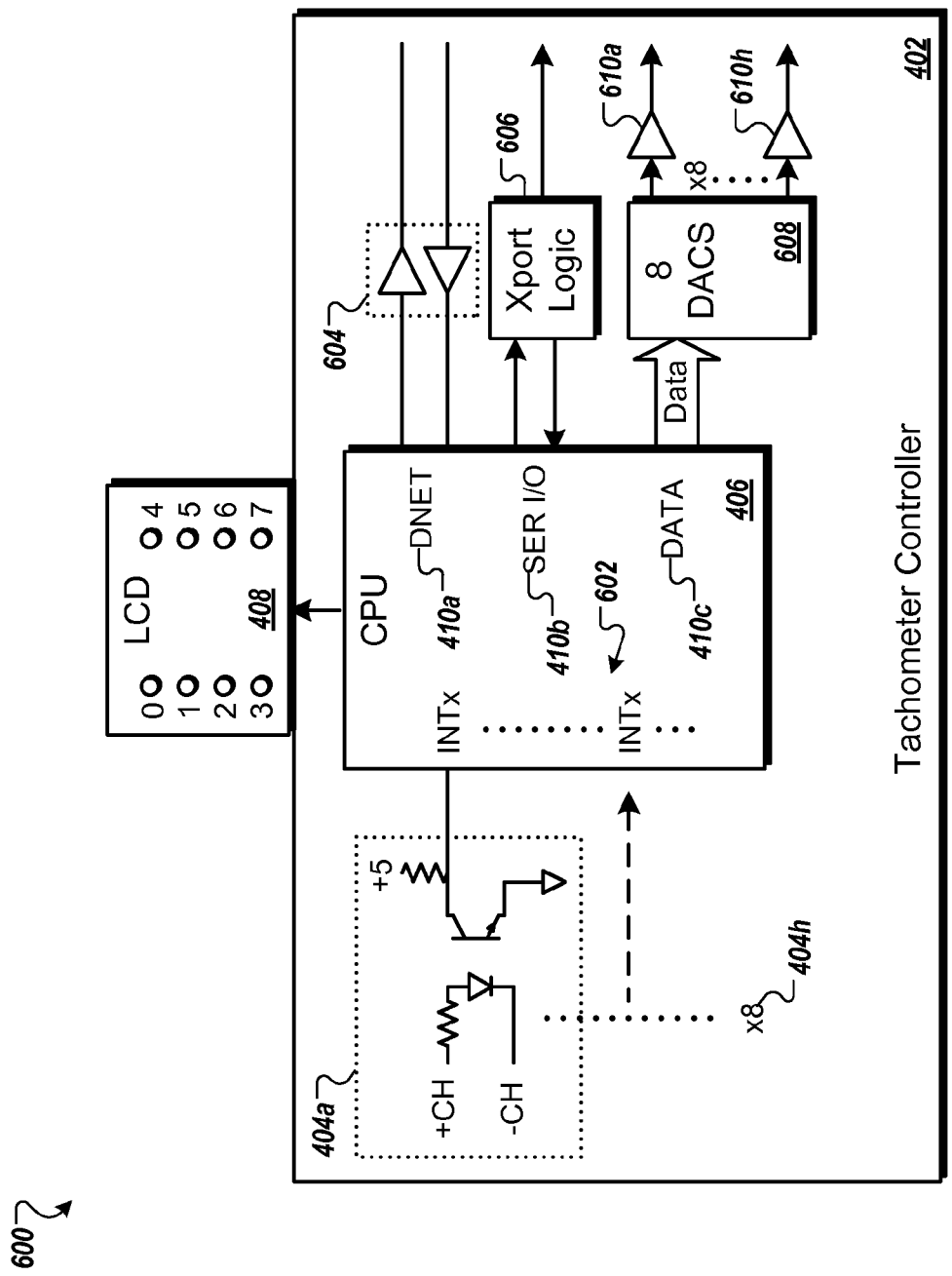
FIG. 6 illustrates an exemplary hardware configuration of a sensor control system for monitoring multiple processing chambers.

FIG. 6 illustrates an exemplary hardware configuration 600 of the sensor control system 402 for monitoring multiple processing chambers. The hardware configuration 600, for example, may be designed to mitigate voltage transients and to protect connecting hardware from electrical signal anomalies within a chamber monitoring system (e.g., the chamber monitoring system 400 as described in FIG. 4).

The sensor control system 402 is configured to receive up to eight optically isolated sensor inputs 404 (e.g., each connected to a sensor such as the sensor 301 of FIG. 3). Each sensor input 404 is comprised of an authorizer with positive channel and negative channel voltage inputs which are galvanically isolated up to 1500 Volts. The authorizer includes forward transistors to ground, ground being internal to the board and floating as per the overall system (e.g., the system 400 as described in FIG. 4). A five Volt pull-up network feeds into the CPU 406. The sensor inputs 404, in some implementations, may draw approximately one milliamp off of the sensor signal line.

The CPU 406, in some implementations, may be running at approximately twelve million instructions per second. The sensor inputs 404 are each connected to a direct or vectored interrupt (INTx) 602 on the CPU 406. In some implementations, the INTx 602 may be a negative interrupt.

In some implementations, the sensor inputs 404 may be indirectly connected to the INTx interrupts 602. For example, one or more INTx interrupts 602 may be connected to port expanders which allow the connection of several sensor lines to a single INTx interrupt 602. The port expanders, for example, may be implemented using port expander chip hardware/firmware built into the sensor control system 402. In another example, off-the-shelf port expanders may be added to the sensor control system 402 to increase the total number of sensors being monitored by the sensor control system 402.

The CPU 406 controls the three I/O lines 410. The sensor bus line 410a includes a set of buffers 604. The serial I/O line 410b includes a multidrop serial link logic module 606. The multidrop serial link logic module 606 controls the daisychaining of the information associated with each sensor device sharing the serial I/O line 410b.

For the analog line 410c, the CPU 406 presents digital data to a set of eight digital to analog converters (DACs) 608. The DACs 608 output analog signals to the analog output line 410c. In some implementations, the analog output line 410c is comprised of eight separate analog lines, each carrying data for a particular sensor attached to the sensor control system 402. The output of the DACs 608, in some implementations, may be adjusted by a set of amplifiers 610. For example, if the DACs 608 output a zero to five Volt range, the amplifiers 610 may increase the analog signal range to zero to ten Volts. The zero to ten Volt range, for example, may map to a zero to two hundred RPM range. In other implementations, electrically selected potentiometers may be used instead of DACs to provide an analog output signal.

The CPU 406 also may drive a display 408. In some implementations, the display 408 includes an LCD screen which presents information regarding each of the sensors monitored by the sensor control system 402.

In some implementations, the CPU 406 may receive its input voltage (e.g., 24V DC) from the sensor bus line 410a or an analog interface. If, however, the serial I/O line 410b is the only I/O line 410 connected to the sensor control system 402, the input power may be derived from a coaxial cable and DC power jack connection. In some implementations, the sensor control system 402 draws approximately two Watts of power or less. For example, the sensor control system 402 may draw approximately one Watt of power.

Exemplary Methods for Monitoring the Rotation of a Processing Chamber Device

Figure 7A:
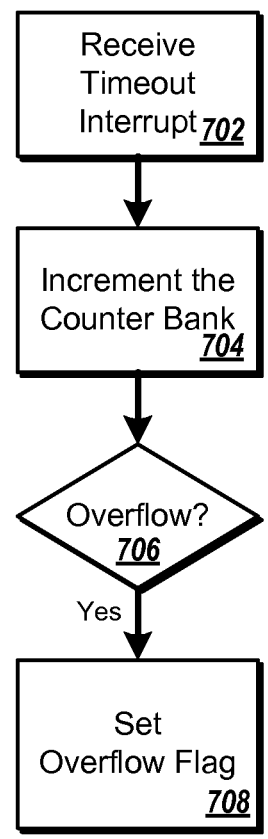
FIGS. 7A and 7B are flow diagrams illustrating an exemplary method for implementing a digital tachometer monitoring multiple rotating devices.
Figure 7B:
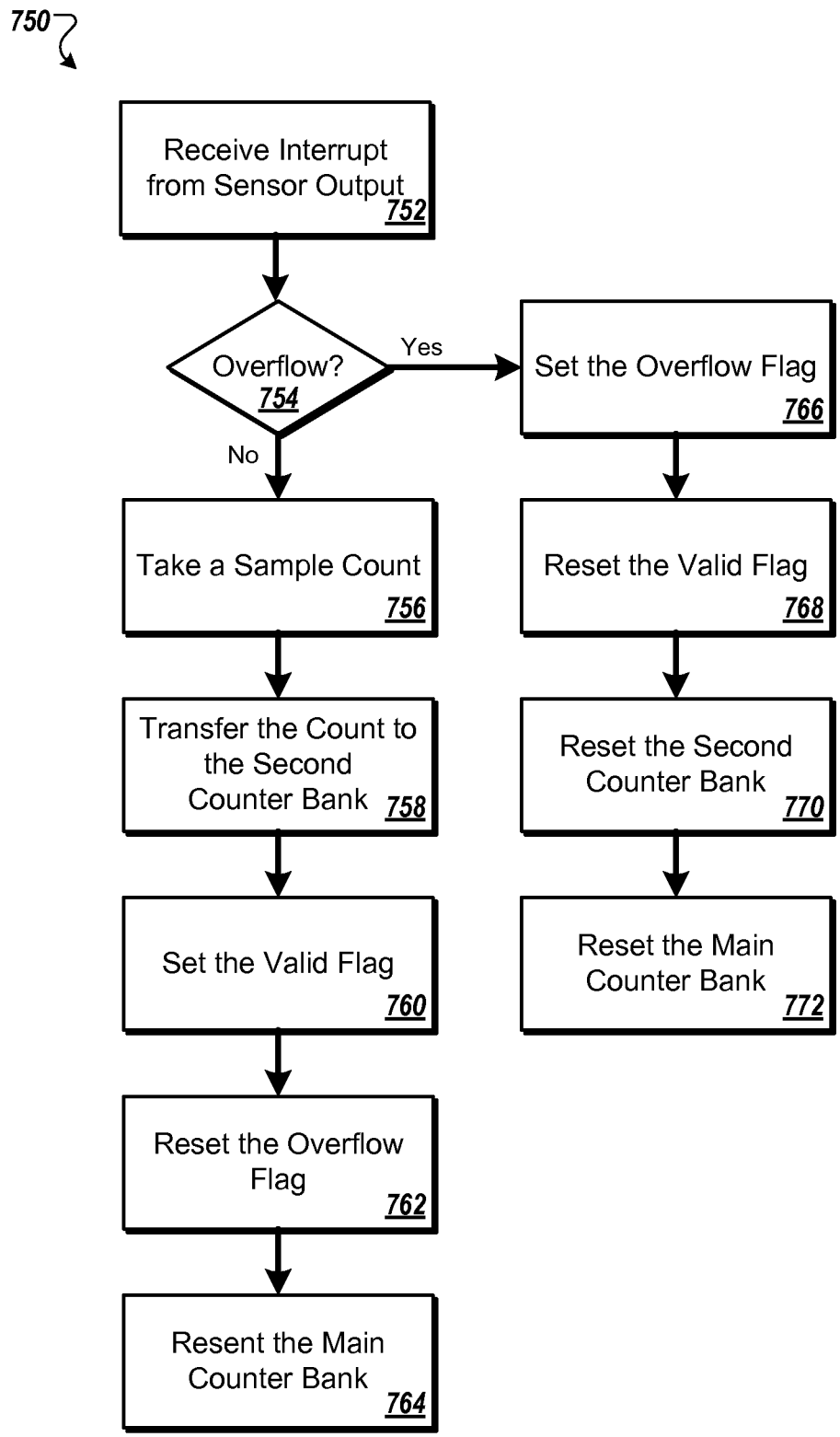

FIGS. 7A and 7B are flow diagrams illustrating exemplary methods for implementing a digital tachometer monitoring multiple rotating devices. The methods, for example, may be implemented within the sensor control system 402 (e.g., using the software and/or firmware included within the CPU 406). The methods may be implemented individually for each rotating mechanism monitored by the digital tachometer.

As shown in FIG. 7A, a first method 700 implements a timeout mechanism for calculating the time between received sensor interrupts. The method 700 may additionally be used for determining when a monitored rotational device is not in motion. For example, the sensor control system 402, rather than waiting for an indefinite period of time for an interrupt from a sensor indicating that a rotating device has completed a revolution, may instead at a predetermined point make the assumption that it has taken too long for a single revolution, and therefore the rotating device is likely not in motion.

The method 700 begins with receiving a timeout interrupt (702). The timeout interrupt, in some implementations, may be a hardware-based timeout value. In some implementations, the timing of the timeout interrupt may be based upon a multiple of a system clock. For example, the timeout interrupt may be generated by a one kilohertz clock output. In other implementations, another clock output including, but not limited to, a ten kilohertz or one hundred kilohertz clock output may be used.

Upon receipt of the timeout interrupt, a counter bank is incremented (704). The counter bank, in some implementations, may be sized such that if incremented at each timeout interrupt, the counter bank may overflow at a timeout value slower than the slowest anticipated RPM value of any monitored rotating device. For example, using a one kilohertz clock, a sixteen-bit counter bank (e.g., the bank of counters 508 as described in FIG. 5) may overflow every 6.5535 seconds. In this example, the slowest anticipated rotational rate may be ten RPM.

If the counter bank has overflowed (706), the overflow flag is set (708). In some implementations, the overflow of the counter bank may trigger an error alert. For example, a user may be alerted at the sensor control system 402 (e.g., audible and/or visible alert via the display 408) or remotely through one or more of the I/O lines 410.

As shown in FIG. 7B, a second method 750 implements an interrupt-driven timing mechanism for determining the rotational speed of a monitored rotational device. The method 750 begins with receiving an interrupt from a sensor output (752). The interrupt, for example, may be received from an attached sensor device at one of the interrupt ports 404 of the sensor control system 402. The interrupt indicates a single revolution of the monitored rotating device.

If the counter bank has not overflowed (754), the method 750 takes a sample count from the counter bank (756). In some implementations, the counter bank 508, incremented as described within the method 700 in FIG. 7A, may be used to calculate the speed of a single revolution of the monitored rotational device. For example, at each sensor interrupt, the number of timer interrupts since the previous sensor interrupt may be collected from the bank of counters 508. The sample count may be transferred to a second counter bank (758). For example, the sample count may be transferred to the sixteen-bit bank of counters 508 (as described in FIG. 5).

A valid flag is set (760), indicating that the second counter bank contains valid data. The valid flag, for example, may be used by a data processing routine. If the valid flag is set to true, a data processing routine may use the sample count collected within the second counter bank to calculate the estimated speed of the rotating device. The overflow flag is reset (762), indicating that no overflow condition occurred during this processing cycle. The main counter bank is reset (764). The method 700, for example, may then continue to collect a count of timer interrupts occurring since the interrupt received in step 752. The method 700 may continue to increment the main counter bank until the next sensor interrupt is received by the method 752.

If, upon receipt of a sensor interrupt (752) the main counter has been found in an overflow condition (754) (e.g., the overflow flag is set to true), the overflow flag is reset to false (766). The valid flag is reset to false (768), the second counter bank is reset to zero (770), and the main counter bank is reset to zero (772), thus re-initializing all flags and counters.

Figure 8:
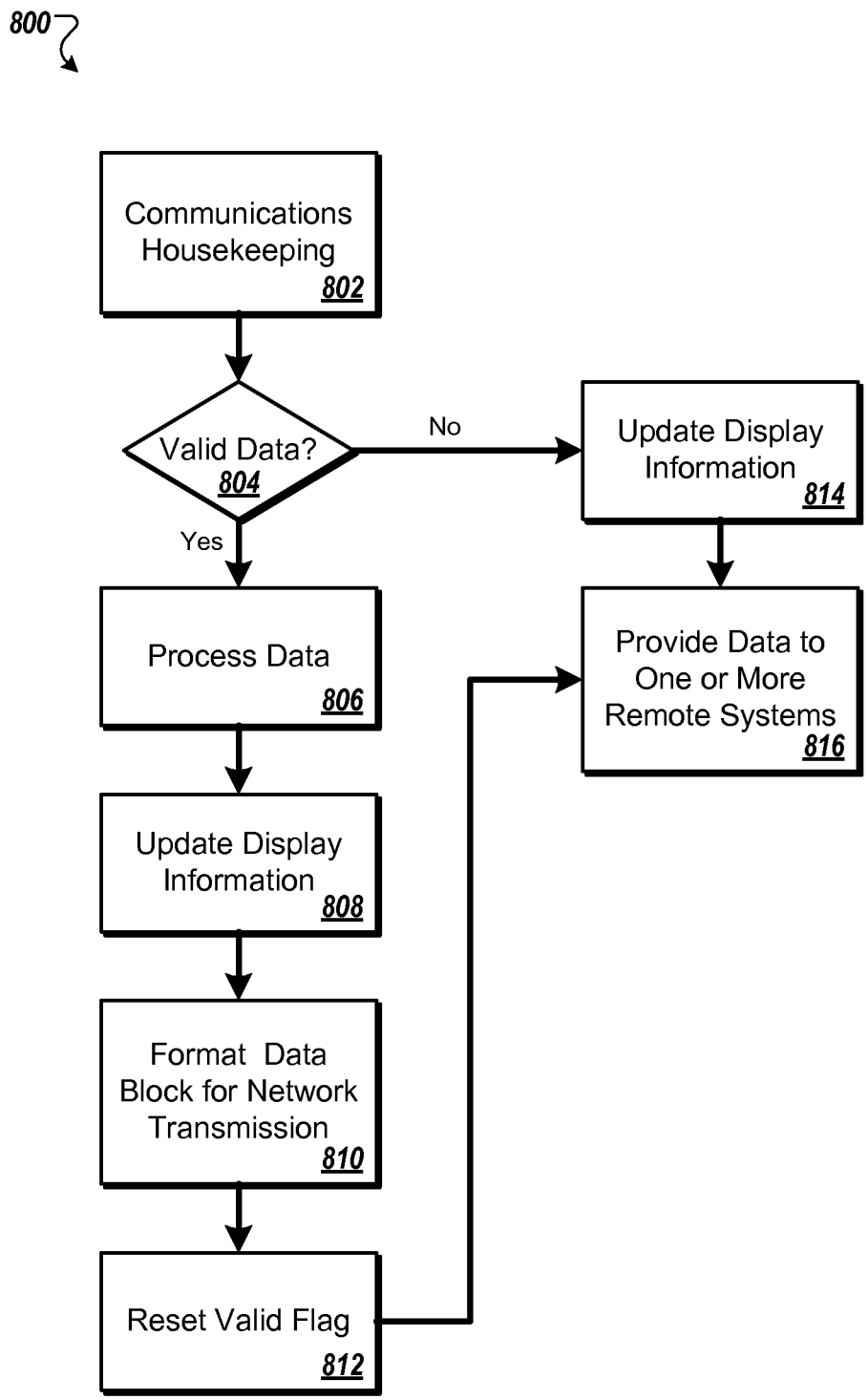
FIG. 8 is a flow diagram illustrating an exemplary method for processing rotational data associated with multiple rotating devices.

FIG. 8 is a flow diagram illustrating an exemplary method 800 for processing rotational data associated with multiple rotating devices. The method 800, for example, may be used in processing the sample data collected by the methods 700 and 750, as described in FIGS. 7A and 7B. For example, the method 800 may be implemented within the software and/or firmware of the CPU 406 of the sensor control system 402.

The method 800 begins with communications housekeeping (802). The communications housekeeping, for example, may include receiving a request for information from one or more remote systems (e.g., connected to the sensor control system 402 by one or more I/O lines 410). In other examples, the communications housekeeping may include receiving hardware interrupts (e.g., the attachment of one or more sensor devices to the interrupt ports 404) or software interrupts (e.g., the recognition of an error condition within the method 700 or 750 as described in FIGS. 7A and 7B). At some point, the communications housekeeping checks for valid data associated with one or more of the rotating devices monitored by the sensor control system 402.

If the valid data flag is set to a value of true (804), data associated with the valid data flag is processed (806). For example, the data within the second counter bank 508 (as described in FIG. 5) may be processed to calculate an RPM value associated with the rotating device being monitored.

Using the value calculated through processing the data, the display information is updated (808). For example, the display 408 connected to the sensor control system 402 may be updated to reflect the RPM value calculated. Additionally, one or more data blocks may be formatted for network transmission of the processed data (810). For example, the calculated RPM value may be transmitted to one or more remote systems over the I/O lines 410. After having processed the data associated with the valid flag, the valid flag is reset to false (812). Data may then be provided to one or more remote systems (816). For example, the user may be alerted as to the present RPM value of the rotating element via one or more remote systems.

The method 800 may repeat the process for each rotating device monitored by the sensor control system 402. If the method 800 finds that the valid data flag associated with a rotating device is set to a value of false (804), the display information may be updated (814) and data may be provided to one or more remote systems (816) regarding the status of the rotating element. For example, the user may be alerted via the display 408 and/or one or more remote systems that the rotating element is not in motion.

In some implementations, the method 800 processes data associated with each monitored sensor before updating the display 408 and/or the remote systems. For example, the processed data may be collected within a data log. The data log, for example, may be used to update the display 408 upon completion of data processing associated with all monitored sensors. In some implementations, the processed data may be collected within a data log until a remote system requests the data. Upon request, the communications housekeeping routine may format data blocks with collected data and transmit the data over the I/O lines 410.

In some implementations, the data may be provided to one or more remote systems based upon user preferences. For example, if the valid data flag is set to false (e.g., the rotating device has stopped), the information may be provided immediately to one or more remote systems. If, instead, the valid data flag is set to true, the information may be collected within a data log and dispatched to the remote system(s) at a later time (e.g., upon request, upon a set batch schedule, etc.).

In some implementations, a user may establish out-of-bounds conditions and associated alarm mechanisms. For example, if a user has set the maximum speed for a particular rotating device at 120 RPM and the method 800 determines a speed of 175 RPM when processing the rotational data associated with the rotating device, the method 800 may immediately alert one or more remote systems of the out-of-bounds condition.

A number of embodiments have been described. It is contemplated that a plurality of the aforementioned specific features can be combined into a single device, as will be understood by those skilled in the art. Nevertheless, it will be understood that various modifications may be made without departing from the spirit and scope of this disclosure. Accordingly, other embodiments are within the scope of the following claims.

What is claimed is:

1. A method comprising:
   monitoring a first substrate rotation mechanism and a second substrate rotation mechanism of a semiconductor processing system using a first sensor and a second sensor;
   receiving first rotation data associated with the first substrate rotation mechanism from the first sensor and second rotation data associated with the second substrate rotation mechanism from the second sensor at a control unit coupled to the first sensor and the second sensor by one or more sensor lines;
   processing the first and second rotation data within the control unit and determining, in the control unit, rotation rates associated with the first and second substrate rotation mechanisms;
   sending the first rotation data and the second rotation data from the control unit to one or more remote control systems;
   generating, by the one or more remote control systems, control parameters for at least one of the first and second substrate rotation mechanisms; and providing, by the remote control system, the control parameters to the control unit.

2. The method of claim 1, further comprising communicating with at least one device that is connected in series with a digital serial output line that connects the control unit to the one or more remote control systems.

3. The method of claim 1, further comprising determining whether one of the first or second substrate rotation mechanisms is reciprocating rather than revolving and issuing an alert to the one or more remote control systems regarding the reciprocation of the first or second substrate rotation mechanism.

4. The method of claim 1, further comprising receiving out-of-bounds conditions from the one or more remote control systems, the out-of-bounds conditions including a maximum rotational speed or a minimum rotational speed associated with the first substrate rotation mechanism, the out-of-bounds conditions being used by the control unit for determining that a rotational speed of the first substrate rotation mechanism is greater than the maximum rotational speed or less than the minimum rotational speed.

5. The method of claim 1, further comprising:
   substantially matching a first pull-up network between a first sensor line of the one or more sensor lines and the control unit to a second pull-up network between a second sensor line of the one or more sensor lines and the remote control system.

6. The method of claim 1, further comprising optically isolating signals received from a sensor line, the signals comprising the first or second rotation data.

7. The method of claim 1, wherein determining at least one of the rotation rates comprises incrementing a first counter bank by timer interrupts.

8. The method of claim 7, further comprising transferring a present value of the first counter bank to a second counter bank when a sensor pulse is received.

9. The method of claim 8, further comprising determining, when the sensor pulse is received, whether the first counter bank has an overflow condition, and if so generating an alert.

10. The method of claim 9, further comprising selecting the first counter bank so that, if incremented at each timer interrupt, the first counter bank over flows slower than a slowest RPM of any monitored device.

11. A system for monitoring the rotation of substrate rotation mechanisms for substrates in substrate processing chambers, comprising:
   a control unit coupled by one or more sensor lines to a first sensor to monitor a first substrate rotation mechanism and to a second sensor to monitor a second substrate rotation mechanism, the control unit configured and arranged to process first rotation data associated with the first substrate rotation mechanism and second rotation data associated with the second substrate rotation mechanism and configured and arranged to determine rotation rates associated with the first and second substrate rotation mechanisms from the first rotation data and the second rotation data; and
   one or more remote control systems connected to the control unit, the one or more remote control systems configured and arranged to receive the first rotation data and the second rotation data from the control unit, to generate control parameters for at least one of the first and second substrate rotation mechanisms, and to transmit the control parameters to the control unit.

12. The system of claim 11, wherein a digital serial output line connects the control unit to one or more remote control systems, the digital serial output line adapted to communicate with multiple devices that are connected in series with the digital serial output line.

13. The system of claim 11, wherein the control unit is configured and arranged to determine whether one of the first or second substrate rotation mechanisms is reciprocating rather than revolving and issue an alert to the one or more remote control systems regarding the reciprocation of the first or second substrate rotation mechanisms.

14. The system of claim 11, wherein the control unit is configured and arranged to receive out-of-bounds conditions from the one or more remote control systems, the out-of-bounds conditions including a maximum rotational speed or a minimum rotational speed associated with the first substrate rotation mechanism, the out-of-bounds conditions being used by the control unit for determining that the rotational speed of the first substrate rotation mechanism is greater than the maximum rotational speed or less than the minimum rotational speed.

15. The system of claim 11, further comprising:
   a first pull-up network between a first sensor line of the one or more sensor lines and the control unit; and
   a second pull-up network between a second sensor line of the one or more sensor lines and the control system, wherein the first pull-up network substantially matches the second pull-up network.

16. The system of claim 15, further comprising an opto-isolator that optically isolates signals received from the first sensor line.

17. The system of claim 15, further comprising first and second counter banks, the first counter bank being incremented by timer interrupts, and a present value of the first counter bank being transferred to the second counter bank when a pulse is received on the first or second sensor line.

* * * * *